(12) United States Patent
Blisson et al.

(10) Patent No.: US 6,919,614 B2
(45) Date of Patent: Jul. 19, 2005

(54) CIRCUIT WITH AN INTEGRATED VOLTAGE REGULATOR AND ITS MANUFACTURING PROCESS

(75) Inventors: Fabrice Blisson, Aix en Provence (FR); Gilles Debeurme, Trets (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/774,896

(22) Filed: Feb. 9, 2004

(65) Prior Publication Data
US 2004/0159894 A1 Aug. 19, 2004

(30) Foreign Application Priority Data
Feb. 11, 2003 (FR) .............................. 03 01624

(51) Int. Cl.$^7$ ................................ H01L 29/00
(52) U.S. Cl. .................................... 257/532
(58) Field of Search ..................... 257/528, 532, 257/690, 691, 773, 774, 775, 776

(56) References Cited

U.S. PATENT DOCUMENTS

| | | |
|---|---|---|
| 5,434,436 A | 7/1995 | Taniguchi et al. |
| 6,617,620 B1 * | 9/2003 | Kawano et al. |
| 2001/0035555 A1 | 11/2001 | Nonaka |
| 2002/0014914 A1 | 2/2002 | Perque et al. |

OTHER PUBLICATIONS

French Search Report from French Patent Application 03/01624, filed Feb. 11, 2003.

* cited by examiner

*Primary Examiner*—Nathan J. Flynn
*Assistant Examiner*—Kevin Quinto
(74) *Attorney, Agent, or Firm*—Lisa K. Jorgenson; James H. Morris; Wolf, Greenfield & Sacks, P.C.

(57) ABSTRACT

An integrated circuit with a D.C./D.C. voltage regulator and its manufacturing process, including at least one power stage provided with at least two transistors and with at least one capacitor connecting a control electrode of the transistor to a reference voltage, a same control stage of the regulator providing a control signal of said transistors, the power stage being formed under a rail that provides supply signals of the integrated circuit, the rail providing at least two limiting supply voltages coming from the outside of the integrated circuit and at least one voltage regulated by the voltage regulator.

18 Claims, 2 Drawing Sheets

CIRCUIT WITH AN INTEGRATED VOLTAGE REGULATOR AND ITS MANUFACTURING PROCESS

BACKGROUND OF THE INVENTION

1. Field of the Invention

The present invention relates to the supply of integrated circuits and, more specifically, to the integration of one or several voltage regulators with the supplied circuit. The present invention more specifically relates to linear D.C./D.C. regulators. Such regulators essentially comprise one control stage and one or several power stages.

2. Discussion of the Related Art

FIG. 1 partially and schematically shows a linear regulator of the type to which the present invention applies.

A power stage 1 comprises one or several MOS transistors 2 having one power terminal 3 (drain or source) connected to a D.C. supply voltage Vps and having its other power terminal 4 (source or drain) providing regulated voltage Vdd. Gate or control terminal 5 of power transistor 2 is connected to the output of a control stage 10 of the regulator. This control stage essentially comprises a comparator 11 (COMP) of a voltage representative of regulated output voltage Vdd with a reference voltage Vref. This reference voltage is most often provided by a commonly-called "bandgap" circuit 12. In the shown example, the voltage representative of the regulated output voltage is obtained by means of a resistive dividing bridge formed of two resistors R1 and R2 in series between terminal 4 and ground GND. Finally, a capacitor 6 damps the variations of the reference value provided by comparator 11 by connecting gate 5 of transistor 2 to ground GND. Circuit 12 and comparator 11 are generally supplied by voltage Vdd. A same control stage 10 can control several power stages 1 all taking part in the provision of voltage Vdd (block 1 shown in dotted lines in FIG. 1). All these stages then receive the same control signal CTRL from stage 10. Similarly, within a same power stage, all transistors receive the same control signal.

The operating principle of a D.C./D.C. series regulator is perfectly well known in the art. The concept of a power transistor used in the present invention does not refer to a high voltage, but to the fact that the power stage must convey a relatively significant supply current (generally ranging between a few hundreds of microamperes and approximately 1 ampere).

The use of a D.C/D.C. regulator in an integrated circuit is linked to the presence of a supply voltage Vps, provided to the circuit, which is greater than supply voltage Vdd of the internal circuit components.

Regulated voltage Vdd is intended to supply different functions linked to the application specific to the integrated circuit. The circuits executing these functions are generally integrated in what is called the circuit core while the regulator, and more specifically its power stages, may be integrated in what is called the integrated circuit crown.

FIG. 2 shows, in a partial simplified top view, a conventional example of embodiment of an integrated circuit 20. In the example of FIG. 2, core 21 of the integrated circuit integrates the functions linked to the application as well as the control stage(s) (not shown in detail) of the voltage regulators. The power stages of the voltage regulator(s) are, as for themselves, integrated in crown 22 of the integrated circuit. This crown surrounds core 21.

Crown 22 generally includes what is called a supply rail (RING) 23 which comprises two conductors 24 and 25 conveying the respective most positive and most negative supply voltages Vps and GND of the integrated circuit. The supply rail may be only partial at the periphery or be arranged differently in the integrated circuit (for example, at the center). The notion of core encompasses, whatever their position, the integrated elements performing the different functions associated with the application specific to the integrated circuit and supplied by a rail having any shape.

An example of an integrated circuit in which the voltage regulation power stages are arranged in an input/output crown of an integrated circuit chip is described in U.S. patent application Ser. No. 09/886,967, which is incorporated herein by reference. The solution described in this document consists of integrating, in the crown locations intended for the input/output pads of the circuit, the power stages, and more specifically, the power transistors of the regulators. The supply rail is, as for itself, untouched.

According to the type of integrated circuit, the general bulk thereof may be linked either to the number of circuits in the core, or to the number of input/output pads necessary for its external connections.

In the first case, the circuit is said to be of "core limited" type, which means that its size is limited by the surface area of the circuit core and not by the perimeter necessary to align on its edges all the input/output pads. Accordingly, the surface area unused by input/output pads in the crown is used for the core. The forming of the power blocks in the crown accordingly reduces the areas recovered by the core, which results in an increase in the circuit size.

Conversely, when the size of the product is limited by the alignment of the input/output pads and not by the core surface area, it is said to be of "pad limited" type. For a constant number of input/output pads, the forming of the power blocks in the crown accordingly increases its perimeter, and thus the circuit surface area.

Further, the surface area required by the integration of the power stages requires, as described in the above-mentioned US document, the flowing of additional signals which each time transit from the core to the crown.

SUMMARY OF THE INVENTION

The present invention aims at improving known solutions by further reducing the bulk of voltage regulators in circuits integrating application functions in their core.

The present invention especially aims at minimizing the bulk of voltage regulation power stages in integrated circuits.

The present invention also aims at minimizing the surface area taken up in the circuit crown by the integration of the power stages of the voltage regulators.

The present invention also aims at making the surface area of the integrated circuit as independent as possible from the surface area of the power blocks.

To achieve these and other objects, the present invention provides an integrated circuit with a D.C./D.C. voltage regulator comprising at least one power stage provided with at least two transistors and with at least one capacitor connecting a control electrode of the transistor to a reference voltage, a same control stage of the regulator providing a control signal of said transistors, the power stage being formed under a rail that provides supply signals of the integrated circuit, said rail providing at least two limiting supply voltages coming from the outside of the integrated circuit and at least one voltage regulated by said voltage regulator.

According to an embodiment of the present invention, said rail further provides said control signal.

According to an embodiment of the present invention, said transistors are formed in an active area underlying two close conductors that provide one of the limiting voltages and of said regulated voltage.

According to an embodiment of the present invention, said capacitor is formed in line with a conductor providing a reference voltage corresponding to one of said limiting voltages.

According to an embodiment of the present invention, the control electrodes of the transistors are formed of parallel conductive strips arranged perpendicularly to the conductors of said rail.

According to an embodiment of the present invention, said voltages are provided in a first metallization level of the integrated circuit.

According to an embodiment of the present invention, said control stage is formed in a core of the integrated circuit, around which is arranged said rail in a crown of circuit inputs/outputs.

The present invention also aims at a method for forming at least one power stage of a voltage regulator formed of at least two MOS transistors and of at least one capacitor connecting a control electrode of said transistors to a reference voltage, comprising forming said transistors under a rail for providing supply signals of the integrated circuit, in a crown of inputs/outputs thereof, said rail providing at least said reference voltage, a regulated voltage provided by the power stages, and a supply voltage thereof.

According to an embodiment of the present invention, said capacitor is formed under said rail.

The foregoing objects, features, and advantages of the present invention will be discussed in detail in the following non-limiting description of specific embodiments in connection with the accompanying drawings.

DETAILED DESCRIPTION

Figure 1:
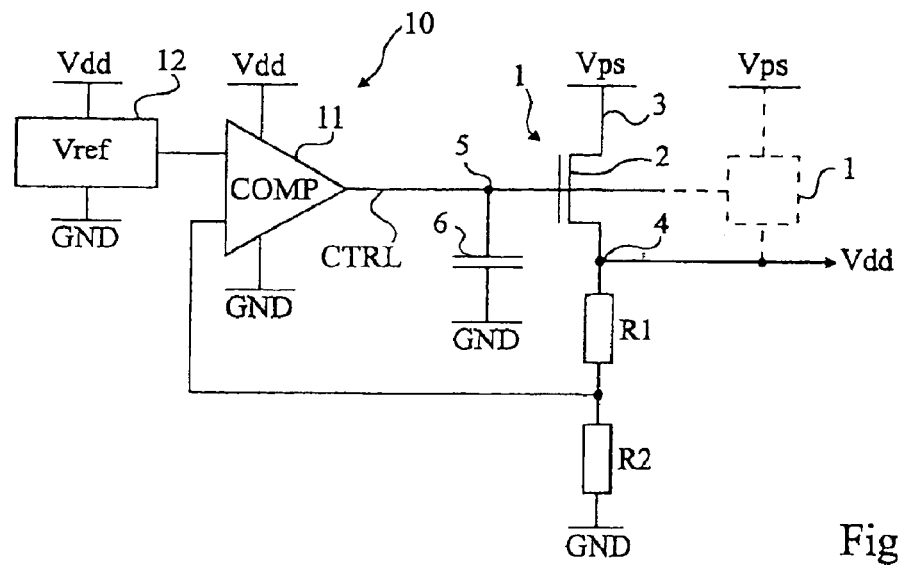
FIGS. 1 and 2, previously described, are intended to show the state of the art and the problem to solve.
Figure 2:
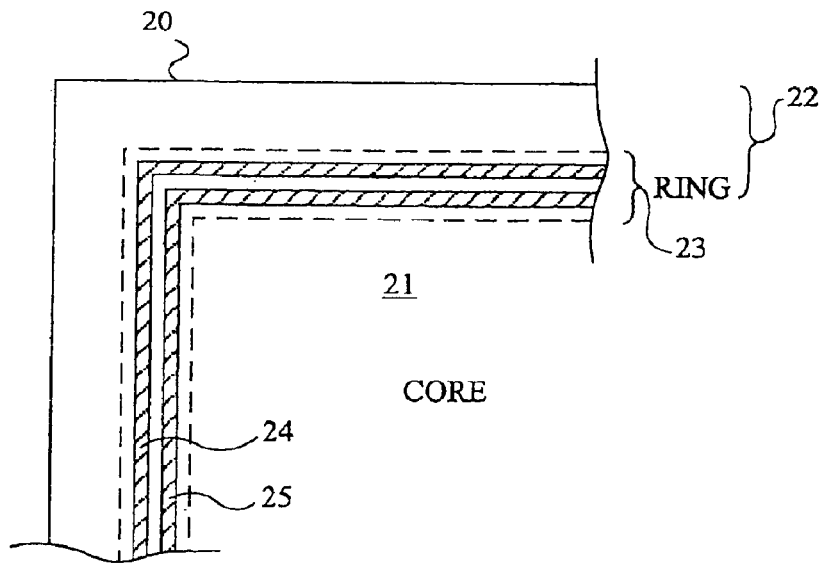

The same elements have been designated with the same reference numerals in the different drawings. For clarity, only those elements that are necessary to the understanding of the present invention have been shown in the drawings and will be described hereafter. In particular, the functions implemented by the integrated circuits of the present invention have not been detailed, the present invention applying whatever the functions integrated in the circuit core. Further, the forming of one or several control stages of the voltage regulators has not been detailed. This forming is generally performed in the circuit core and respects conventional forming modes.

A feature of the present invention is to integrate, under the supply rail of an integrated circuit crown, the power stage(s) of the voltage regulator used to supply the integrated circuit. Another feature of the present invention is to provide, in the peripheral supply rail of the circuit, at least three conductors respectively providing the limiting supply voltages of the voltage regulators (generally, the ground and the relatively high supply voltage) and the regulated voltage. Preferably, a fourth conductor, in which flows a control signal common to the power stages of the regulator or at least to the transistors of a same stage, is also present in the peripheral supply rail.

Figure 3:
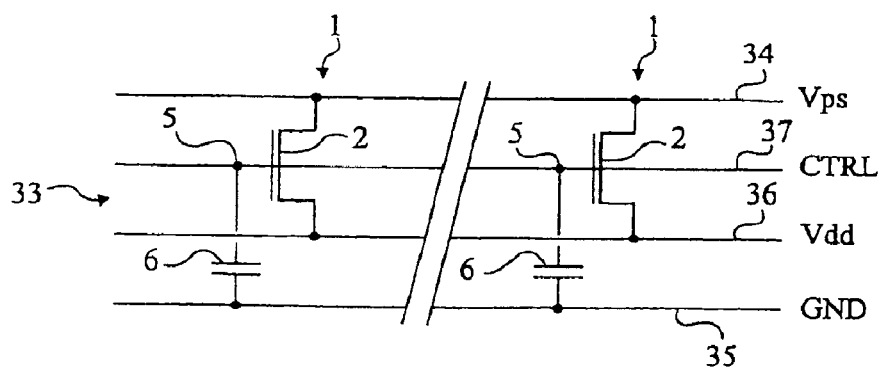
FIG. 3 shows the equivalent electric diagram of a supply rail of an integrated circuit according to the present invention.

FIG. 3 schematically shows a supply rail 33 according to a preferred embodiment of an integrated circuit according to the present invention. In FIG. 3, the supply rail has only been shown by its conductors, and the electric diagram of the integrated power stage components according to the present invention has been shown under this rail.

Rail 33 provides, as previously, two limiting supply voltages (Vps and GND) of the integrated circuit through two conductors 34 and 35. Voltage Vps originates from outside of the circuit and corresponds, for example, to the supply voltage sampled on a printed circuit board on which the integrated circuit is assembled. Voltage GND generally corresponds to the circuit ground. Of course, these are relative potentials, in that the circuit could be supplied by a voltage negative with respect to an external ground.

According to the present invention, supply rail 33 also provides at least regulated voltage Vdd over a conductor 36 and, preferably, a control signal CTRL common to power stages 1 of the regulator. Signal CTRL is conveyed by a fourth conductor 37.

In FIG. 3, two power stages 1 of a transistor have been shown. It should however be noted that, in practice, a power stage comprises several transistors. In fact, what matters is the number of transistors, whatever the number of stages in which they are distributed. For simplification, it will indifferently be spoken of a power stage or of a transistor. According to the present invention, the number of stages 1 (and thus of transistors) to be distributed in the supply rail depends on the power required for the circuit core.

As previously, each power stage is formed of MOS transistors 2 connected between conductors 34 and 36, and having their control electrodes 5 (gate) receiving signal CTRL. Referring to the electric diagram, each transistor 2 is associated with a capacitor 6 connected between gate 5 of the transistor and ground GND (conductor 35). The operation of the power stages of an integrated circuit according to the present invention is identical to the operation previously described in relation with FIG. 1, that is, signal CTRL modulates the gate-source voltage of transistors 2 to control voltage Vdd with a predetermined reference (not shown in FIG. 3).

According to the present invention, transistors 2 and capacitors 6 are arranged under the conductors of the supply rail. The present invention thus takes advantage of the substrate surface area available under this rail to form transistors 2 therein.

Figure 4:
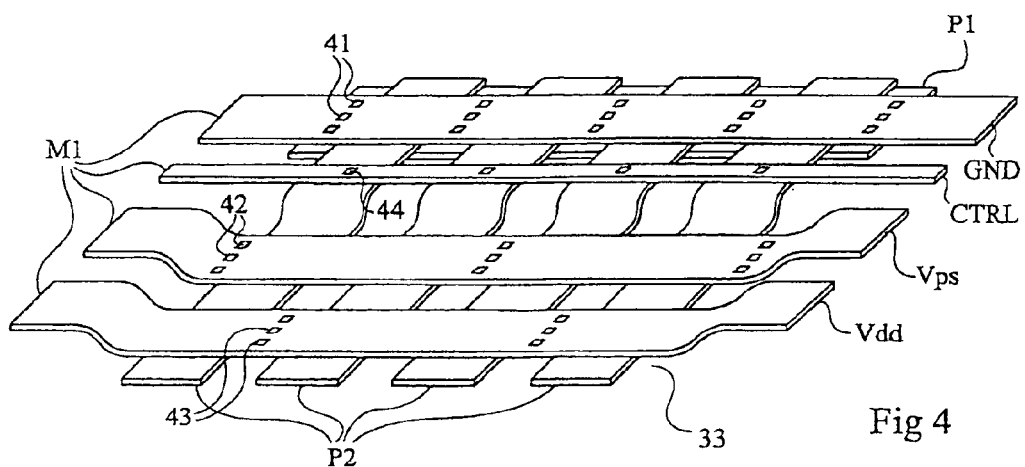
FIG. 4 is a perspective view of the conductive levels used in a supply rail according to the present invention.
Figure 5:
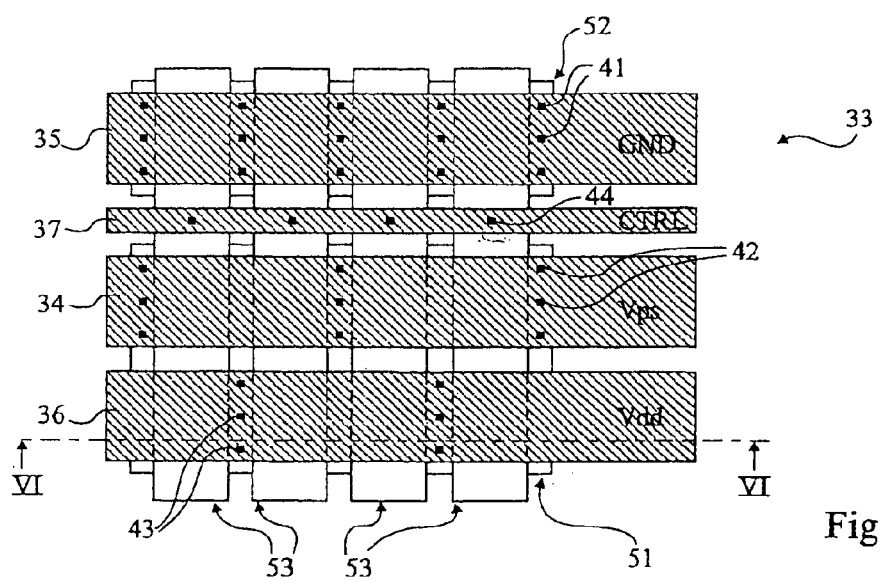
FIG. 5 is a top view of the representation of FIG. 4.
Figure 6:
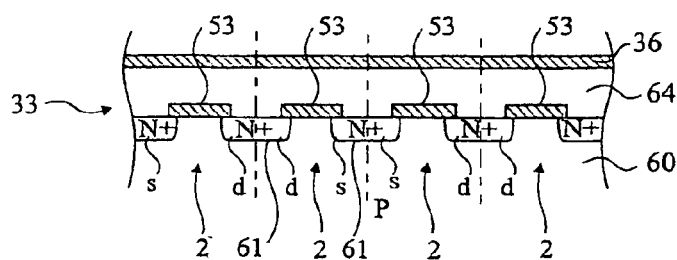
FIG. 6 is a cross-section view of the supply rail along line VI—VI of FIG. 5.

FIG. 4 illustrates, in a partial perspective view, an embodiment of the conductive levels of a supply rail of an integrated circuit according to the present invention. FIG. 5 shows a top view of rail 33 of FIG. 4. FIG. 6 is a partial cross-section view along line VI—VI of FIG. 5.

According to the present invention, at least transistors 2 constitutive of power stages of a voltage regulator of the circuit are formed straight above the area provided for supply rail 33. For example (FIG. 6), the transistors are N-channel transistors having their respective sources and drains formed of $N^+$-doped regions 61 in a P-type substrate 60. In FIG. 5, the active area in which regions 61 have been formed has been generally designated with reference numeral 51 representing the active area of the regulator transistors. As appears from this drawing, this active area remains within the width of supply rail 33 and more specifically above conductors 34 and 36 providing voltages Vps and Vdd respectively corresponding to the drains and sources of transistors 2.

After forming of the active transistors areas, the electrode of capacitors 6, on the side of ground GND, is formed in a first polysilicon level designated with reference P1 in FIG. 4. These electrodes are formed of a strip 52 (FIG. 5) above ground conductor 35 across the width of the supply rail. The width of strip 52 depends on the sizing desired for capacitors 6. Strip 52 is preferentially continuous along the entire length of the supply rail integrating power stages 1 according to the present invention. An area for strip 52 and an area for strip 51 of active areas in which are formed power transistors 2 are provided under the supply rail.

Once electrode 52 of the capacitors has been formed, gates 5 of power transistors 2 are formed in a second polysilicon level P2. These gates are formed of conductive strips 53 (FIG. 5) perpendicular to conductors 34 to 37 of the rail and are formed along a length extending from above active area 51 to above strip 52 to define the second electrode of capacitors 6. Preferably, conductor 37 conveying the control signal is arranged between conductors 34 and 35, conductor 35 being formed above strip 52 and conductors 34 and 36 being formed above area 51.

It should be noted that gate sections 53 have a length approximately corresponding to the width of the integrated circuit supply rail while the other conductive levels extending in the other direction (periphery of the integrated circuit) are preferentially continuous over the entire circuit periphery, although this is not shown in FIGS. 4 and 5.

Of course, the different conductive levels, be they the polysilicon levels or the metal level, which will be described hereafter, are separated by adapted insulating layers. In particular, the thickness of the insulating layer separating the two polysilicon levels P1 and P2 forms the dielectric of capacitors 6.

After deposition of an insulating level 64 (FIG. 6) on polysilicon level P2, a first metallization level M1 (FIG. 4) in which are formed peripheral conductors 34 to 37 of the supply rail is deposited.

As more specifically appears from FIGS. 4 and 5, the different connections between levels P1, P2, and M1 are performed by means of connection vias crossing the corresponding insulating layers. The width of strips 53 corresponds to parameter L of the transistors. Vias 41 connecting levels P1 and M1 are provided, straight above ground rail 35, between strips 53, to connect the ground electrode of capacitors 6.

Vias 42 connect level M1 to active area 51 straight above conductor 34 providing voltage Vps, at the level of drains d (FIG. 6) of power transistors 2. Accordingly, vias 42 are not formed between each gate strip 53, but one strip out of two. In alternation with the intervals in which are formed vias 42, vias 43 of connection of active area 51 at the level of sources s of the transistors to metallization level M1 are formed, straight above conductor 36 providing regulated voltage Vdd. Thus, as appears from FIG. 6, $N^+$-doped regions 61 common to two neighborail transistors form either the drain or the source of the two transistors, alternately.

Although this has not been shown in the drawings, the contact recoveries of signal CTRL towards the integrated circuit core to be connected to the regulator control stage are performed in other higher metallization levels, generally provided for the integrated circuit. As illustrated in FIGS. 4 and 5, vias 44 connect each gate section 53 to metallization M1 straight above conductor 37 conveying control signal CTRL.

Similarly, tracks formed in higher metallization levels distribute ground signal GND in the circuit core and enable connecting conductor 34 providing the external supply voltage from an input/output pad of the integrated circuit.

An advantage of the present invention is that it reduces or minimizes the surface area taken up by a total integrated circuit by enabling integration of the power transistors under the supply rail.

Another advantage of the present invention is that it requires no additional step with respect to the usual integrated circuit manufacturing method. Indeed, the forming of transistors in the active area uses conventional steps implemented in the circuit core, as well as the steps of deposition and etching of the different polysilicon and metallization levels.

The price to pay to implement the present invention is to have two polysilicon levels to form the electrode of capacitors 6 on the ground side, before gates 5 of transistors 2.

As an alternative, capacitors 6 may be formed directly in strips of active areas by using N-type semiconductor capacitor manufacturing technologies. In this case, one polysilicon level is eliminated.

Of course, the present invention is likely to have various alterations, modifications, and improvements which will readily occur to those skilled in the art. In particular, the sizes to be given to the different conductors, active areas, and polysilicon strips are within the abilities of those skilled in the art based on the functional indications given hereabove and on the application. Preferably, it will be attempted to distribute the power transistors over the maximum length of the supply rail according to the desired power, rather than to widen said rail, to minimize the generally circuit bulk.

Further, and especially according to the desired power, a circuit according to the present invention may comprise both power stages integrated under the supply rail and power stages integrated either in the crown outside of the rail as described in the above-mentioned US application, or directly in the integrated circuit core.

Moreover, the present invention is compatible with the distribution of several different voltage levels Vdd in the integrated circuit. Indeed, it is enough for this purpose to provide discontinuous lengths of conductors 36 and 37 respectively conveying the control and regulated voltage signals. Several regulated voltages may thus be distributed at different locations of the integrated circuit. It should be noted that the fact the conductor 36 is the conductor placed closer to the integrated circuit core forms a preferred embodiment since this eases the distribution of the regulated voltage in the circuit core.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit with a D.C./D.C. voltage regulator comprising at least one power stage provided with at least two transistors and with at least one capacitor connecting a control electrode of the transistor to a reference voltage, a same control stage of the regulator providing a control signal of said transistors, wherein the power stage is formed under a rail that provides supply signals of the integrated circuit, said rail providing at least two limiting supply voltages coming from the outside of the integrated circuit and at least one voltage regulated by said voltage regulator.

2. The circuit of claim 1, wherein said rail further provides said control signal.

3. The circuit of claim 1, wherein said transistors are formed in an active area underlying two close conductors that provides one of the limiting voltages and of said regulated voltage.

4. The circuit of claim 1, wherein said capacitor is formed straight above a conductor providing a reference voltage corresponding to one of said limiting voltages.

5. The circuit of claim 1, wherein the control electrodes of the transistors are formed of parallel conductive strips arranged perpendicularly to the conductors of said rail.

6. The circuit of claim 1, wherein said voltages are provided in a first metallization level of the integrated circuit.

7. The circuit of claim 1, wherein said control stage is formed in a core of the integrated circuit, around which is arranged said rail in a crown of circuit inputs/outputs.

8. A method for forming at least one power stage of a voltage regulator of an integrated circuit, the at least one power stage being formed of at least two MOS transistors and of at least one capacitor connecting a control electrode of said transistors to a reference voltage, comprising forming said transistors under a rail that provides supply signals of the integrated circuit, in a crown of inputs/outputs thereof, said rail providing at least said reference voltage, a regulated voltage provided by the power stages, and a supply voltage thereof.

9. The method of claim 8, wherein said capacitor is formed under said rail.

10. An integrated circuit comprising at least one power stage provided with at least two transistors and with at least one capacitor for connecting a control electrode of the transistor to a reference voltage, a same control stage of a regulator providing a control signal of said transistors, wherein the power stage is formed under a rail that provides supply signals of the intregrated circuit, said rail is providing at least two limiting supply voltages coming from the outside of the integrated circuit and at least one regulated voltage.

11. The circuit of claim 10, wherein said rail further provides said control signal.

12. The circuit of claim 10, wherein said transistors are formed in an active area underlying two close conductors that provides one of the limiting voltages and of said regulated voltage.

13. The circuit of claim 10, wherein said capacitor is formed straight above a conductor providing a reference voltage corresponding to one of said limiting voltages.

14. The circuit of claim 10, wherein the control electrodes of the transistors are formed of parallel conductive strips arranged perpendicularly to the conductors of said rail.

15. The circuit of claim 10, wherein said voltages are provided in a first metallization level of the integrated circuit.

16. The circuit of claim 10, wherein said control stage is formed in a core of the integrated circuit, around which is arranged said rail in a crown of circuit inputs/outputs.

17. A method for forming at least one power stage of a voltage regulator of an integrated circuit, the at least one power stage being formed of at least two MOS transistors and of at least one capacitor for connecting a control electrode of said transistors to a reference voltage, comprising forming said transistors under a rail that provides supply signals of the integrated circuit, in a crown of inputs/outputs thereof.

18. The method of claim 17, wherein said capacitor is formed under said rail.

* * * * *